(12) United States Patent
Watanabe

(10) Patent No.: US 7,056,836 B2
(45) Date of Patent: Jun. 6, 2006

(54) MANUFACTURING METHOD FOR A SEMICONDUCTOR DEVICE

(75) Inventor: Hitomi Watanabe, Chiba (JP)

(73) Assignee: Seiko Instruments Inc., Chiba (JP)

( * ) Notice: Subject to any disclaimer, the term of this patent is extended or adjusted under 35 U.S.C. 154(b) by 9 days.

(21) Appl. No.: 10/616,732

(22) Filed: Jul. 10, 2003

(65) Prior Publication Data

US 2004/0058558 A1    Mar. 25, 2004

(30) Foreign Application Priority Data

Jul. 11, 2002    (JP) .............................. 2002-202508

(51) Int. Cl.
*H01L 21/31*    (2006.01)
(52) U.S. Cl. ...................... 438/775; 438/756; 438/777
(58) Field of Classification Search ................ 438/758, 438/622, 618, 624, 777, 756, 775, 981
See application file for complete search history.

(56) References Cited

U.S. PATENT DOCUMENTS

| | | | |
|---|---|---|---|
| 6,235,590 B1 * | 5/2001 | Daniel et al. ............... | 438/275 |
| 6,423,565 B1 * | 7/2002 | Barth et al. .................... | 438/57 |
| 6,436,848 B1 * | 8/2002 | Ramkumar .................. | 438/777 |
| 6,607,948 B1 * | 8/2003 | Sugiyama et al. .......... | 438/151 |
| 6,767,812 B1 * | 7/2004 | Abe et al. ................... | 438/581 |
| 6,787,480 B1 * | 9/2004 | Aoki et al. .................. | 438/775 |
| 6,797,606 B1 * | 9/2004 | Noguchi et al. ............. | 438/622 |
| 6,797,609 B1 * | 9/2004 | Noguchi et al. ............. | 438/627 |
| 6,815,330 B1 * | 11/2004 | Noguchi et al. ............. | 438/622 |
| 2004/0072397 A1 * | 4/2004 | Lowe et al. ................. | 438/200 |

* cited by examiner

Primary Examiner—Alexander Ghyka
(74) Attorney, Agent, or Firm—Adams & Wilks

(57) ABSTRACT

In a method for manufacturing a semiconductor device, a first silicon oxide film is formed on a semiconductor substrate. The first silicon oxide film is nitrided so that silicon oxynitride forms at an interface between the semiconductor substrate and the first silicon oxide film. The first silicon oxide film is removed from a portion of the semiconductor substrate using a chemical containing at least an ammonia-hydrogen peroxide solution so that the silicon oxynitride formed at the interface between the portion of the semiconductor substrate and the first silicon oxide film is completely removed. Thereafter, a second silicon oxide film is formed in the portion of the semiconductor substrate from which the first silicon oxide film and the silicon oxynitride have been removed.

10 Claims, 2 Drawing Sheets

MANUFACTURING METHOD FOR A SEMICONDUCTOR DEVICE

BACKGROUND OF THE INVENTION

1. Field of the Invention

The present invention relates to a manufacturing method for a semiconductor device and, in particular, to a manufacturing method for a device having silicon oxide films with at least two different thicknesses, which includes a process for improving a reliability of the silicon oxide film.

2. Description of the Related Art

Up to now, in manufacturing a MOS transistor having gate oxide films with two different thicknesses on a semiconductor substrate, the following processes have been adopted for improving the reliability of one of the gate oxide films.

First, as shown in FIG. 2A, an element isolation film 10 is formed on a silicon semiconductor substrate 9 using any well-known technique. After that, a first gate oxide (insulating) film 11 is formed, for example, through thermal oxidation of the silicon substrate. Active regions are formed in two or more regions owing to the existence of the element isolation film 10.

Next, as shown in FIG. 2B, the first gate insulating film 11 is subjected to nitriding. In general, through the nitriding, nitrogen is segregated at an interface between the silicon substrate and the gate oxide film as a silicon oxynitride 12 to cover an interface state or a trap, resulting in an improved reliability of the first gate insulating film.

Subsequently, as shown in FIG. 2C, a mask member 13, which is used for opening at least a portion where a second gate oxide film is to be formed, is made of, for example, a photoresist film using any well-known technique. Thereafter, a part of the first gate oxide film is selectively removed.

In general, the removal of the first gate oxide film is made using hydrofluoric acid. The application of hydrofluoric acid alone is insufficient for removing the silicon oxynitride (film) 12 formed at the interface between the silicon substrate and the gate oxide film. As a result, the silicon oxynitride 12 remains on the silicon substrate surface.

Next, as shown in FIG. 2D, the mask member 13 is removed, followed by forming a second gate oxide film 14, for example, through the thermal oxidation of the silicon substrate.

Subsequently, as shown in FIG. 2E, a gate electrode film 15 and source/drain 16 of a transistor are formed using any well-known technique. Through the above processes, the MOS transistor is manufactured.

According to a conventional manufacturing method, the second gate oxide film is formed while the silicon oxynitride formed upon nitriding the first gate oxide film remains on the silicon substrate surface. As a result, in the case of forming the second gate oxide film, in particular, through the thermal oxidation, the silicon oxynitride acts thereon as an inhibitor against the oxidation, which causes such a problem as a remarkable deterioration in reliability of the second gate oxide film.

SUMMARY OF THE INVENTION

The present invention has been made in terms of the above-mentioned problems and an object of the present invention is to improve a manufacturing method and solve the above-mentioned problems.

According to the present invention, when a first gate insulating film is removed for forming a second gate oxide film or when a silicon substrate is washed just before the formation of the second gate oxide film, a manufacturing method includes treatment with an ammonia-hydrogen peroxide solution, whereby a silicon oxynitride film at a site where the second gate oxide film is to be formed can be removed prior to the formation of the second gate oxide film.

DETAILED DESCRIPTION OF THE PREFERRED EMBODIMENT

Figure 1A:
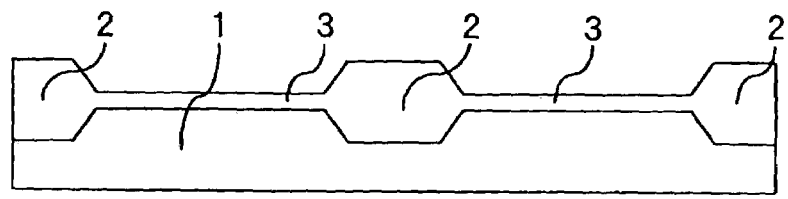
FIGS. 1A to 1E are sectional views of an embodiment of the present invention in a step order.

Hereinafter, an embodiment of the present invention will be described with reference to FIGS. 1A to 1E. First, as shown in FIG. 1A, an element isolation film 2 is formed on a silicon semiconductor substrate 1 using any well-known technique. After that, a first gate insulating film 3 made of silicon oxide and having a first thickness is formed, for example, through thermal oxidation of the silicon substrate. Semiconductor active regions are formed in two or more regions apart from one another owing to existence of the element isolation film 2.

Figure 1B:
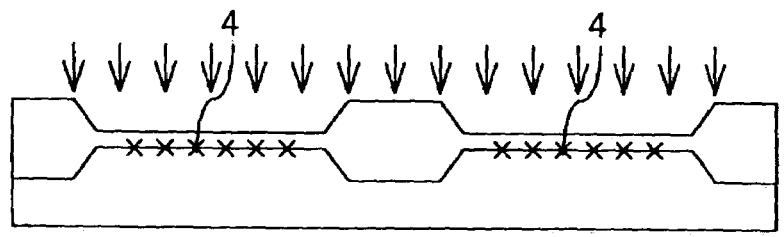

Next, as shown in FIG. 1B, the first gate insulating film 3 is subjected to nitriding. In general, through the nitriding, nitrogen is segregated at an interface between the silicon substrate and the gate oxide film as a silicon oxynitride 4 to cover an interface state or a trap, resulting in an improved reliability of the first gate insulating film. In addition, a dinitrogen monoxide gas or an ammonia gas is used for nitriding. In particular, in the case of using the ammonia gas, higher activity can be achieved and thus, more silicon oxynitrides can be readily formed at the interface as compared with the dinitrogen monoxide gas.

Figure 1C:
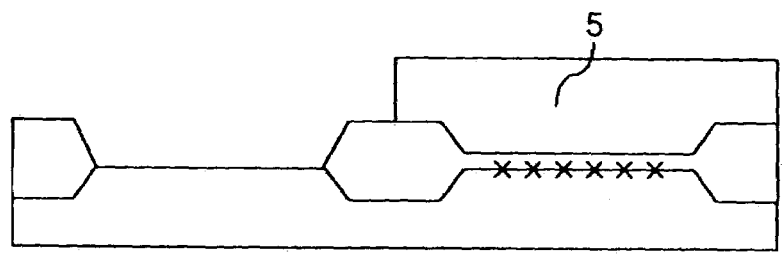

Subsequently, as shown in FIG. 1C, a mask member 5 used for opening at least a portion where a second gate oxide film is to be formed is made of, for example, a photoresist film using any well-known technique. Thereafter, a part of the first gate oxide film in the active region is selectively removed. In general, the removal of the first gate oxide film is made using hydrofluoric acid. The application of hydrofluoric acid alone is insufficient for removing the silicon oxynitride (film) 4 formed at the interface between the silicon substrate and the gate oxide film. To cope therewith, treatment with chemicals containing ammonia-hydrogen peroxide is added to the process for removal. The ammonia-hydrogen peroxide solution has an etching property against silicon or silicon nitride and thus, serves to remove the silicon oxynitride 4 as well.

Alternatively, when the first gate oxide film is selectively removed the treatment with the hydrofluoric acid is solely performed as in the conventional method. Thereafter, at the time of washing the silicon substrate just before the second gate oxide film is formed, the treatment with the chemicals containing ammonia-hydrogen peroxide is added, which can provide the same effects.

Figure 1D:
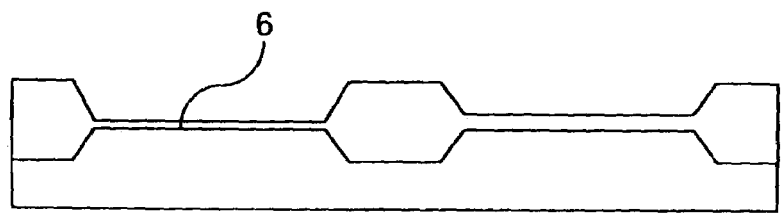

Next, as shown in FIG. 1D, the mask member 5 is removed, followed by forming a second gate insulating film 6, for example, through the thermal oxidation of the silicon substrate 1. The second gate oxide film 6 is made of silicon oxide and has a second thickness different from the first thickness (e.g., in the embodiment of FIGS. 1A–1E, the first thickness is greater than the second thickness). At this time, no silicon oxynitride serving as an inhibitor against the oxidation remains on the silicon substrate surface on which the second gate oxide film is formed. Thus, the high-quality gate oxide film can be formed.

Figure 1E:
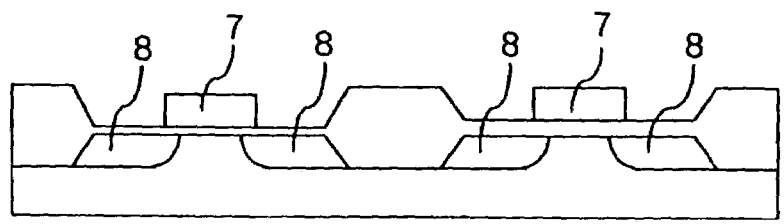
Figure 2A:
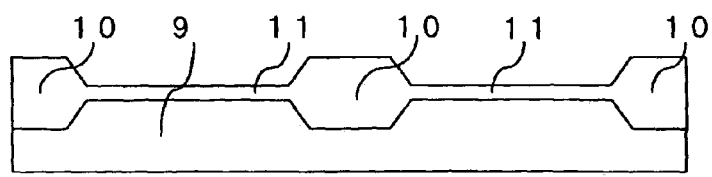
FIGS. 2A to 2E are sectional views of the prior art in a step order.
Figure 2B:
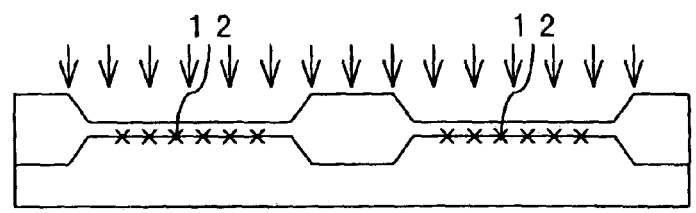
Figure 2C:
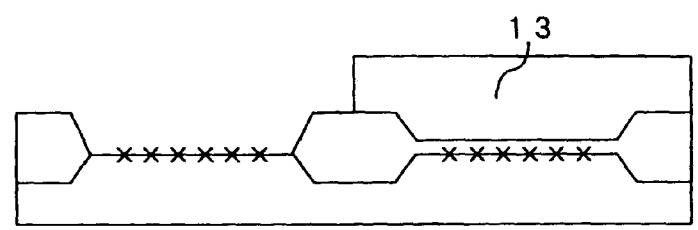
Figure 2D:
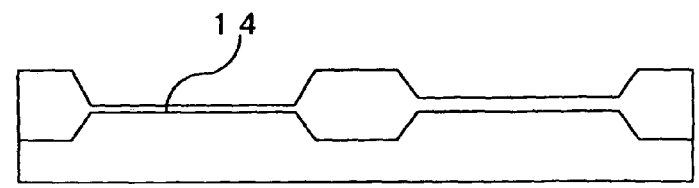
Figure 2E:
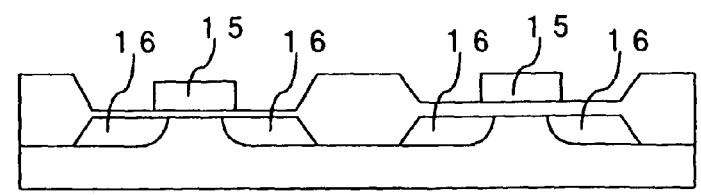

Subsequently, as shown in FIG. 1E, a gate electrode film 7 and source/drain 8 of a transistor are formed using any well-known technique. Through the above processes, the MOS transistor is manufactured.

Hereinabove, given as the embodiment is the MOS transistor in which the first and second oxide films are both used as the gate oxide films. Needless to say, however, the present invention is applicable to the following manufacturing methods for the device and the same effects can be obtained.
1. A manufacturing method for a semiconductor device in which the first oxide film is used as an insulating film of a MOS capacitor element, whereas the second oxide film is used as the gate oxide film of the MOS transistor.
2. A manufacturing method for a semiconductor device in which the first oxide film is used as the gate oxide film of the MOS transistor, whereas the second oxide film is used as the insulating film of the MOS capacitor element.
3. A manufacturing method for a semiconductor device in which the first and second oxide films are both used as the insulating films of the MOS capacitor element.

According to the present invention, as set forth above, the silicon oxynitride formed after nitriding is removed from the portion where the second gate oxide film is formed and hence, no inhibition occurs against the oxidation upon the formation of the second gate oxide film, whereby the reliability of the second gate oxide film can be kept high.

What is claimed is:

1. A method for manufacturing a semiconductor device, comprising the steps of:
    forming a first silicon oxide film having a first thickness on a silicon substrate;
    nitriding the first silicon oxide film so that silicon oxynitride forms at an interface between the silicon substrate and the first silicon oxide film;
    removing the first silicon oxide film from a part of the silicon substrate using a chemical containing at least an ammonia-hydrogen peroxide solution so that the silicon oxynitride formed at the interface between the part of the silicon substrate and the first silicon oxide film is completely removed; and
    forming a second silicon oxide film in at least a portion of the part of the silicon substrate from which the first silicon oxide film and the silicon oxynitride have been removed, the second silicon oxide film having a second thickness different from the first thickness.

2. A method for manufacturing a semiconductor device according to claim 1; wherein the nitriding step includes the step of using an ammonia gas.

3. A method for manufacturing a semiconductor device, comprising the steps of:
    forming a first silicon oxide film having a first thickness on a silicon substrate;
    nitriding the first silicon oxide film so that silicon oxynitride forms at an interface between the silicon substrate and the first silicon oxide film;
    removing the first silicon oxide film from a part of the silicon substrate;
    washing the part of the silicon substrate from which the first silicon oxide film has been removed using a chemical containing at least an ammonia-hydrogen peroxide solution so that the silicon oxynitride formed at the interface between the part of the silicon substrate and the first silicon oxide film is completely removed; and
    forming a second silicon gate oxide film in at least a portion of the part of the silicon substrate from which the first silicon oxide film and the silicon oxynitride are removed, the second silicon oxide film having a second thickness different from the first thickness.

4. A method for manufacturing a semiconductor device according to claim 3; wherein the nitriding step includes the step of using an ammonia gas.

5. A method for manufacturing a semiconductor device, comprising the steps of:
    forming a first silicon oxide film on a semiconductor substrate;
    subjecting the first silicon oxide film to an atmosphere containing at least an ammonia gas so that silicon oxynitride forms at an interface between the semiconductor substrate and the first silicon oxide film;
    completely removing the first silicon oxide film and the corresponding silicon oxynitride from a portion of the semiconductor substrate; and
    forming a second silicon oxide film on the portion of the semiconductor substrate from which the first silicon oxide film and the silicon oxynitride have been completely removed.

6. A method for manufacturing a semiconductor device according to claim 5; wherein the removing step comprises a first step of completely removing the first silicon oxide film from the portion of the semiconductor substrate, and a second step of washing the portion of the semiconductor substrate from which the first silicon oxide film has been removed using a chemical containing at least an ammonia-hydrogen peroxide solution to completely remove the silicon oxynitride formed at the interface between the portion of the semiconductor substrate and the first silicon oxide film.

7. A method for manufacturing a semiconductor device according to claim 6; wherein the first step comprises the step of using an hydrofluoric acid to completely remove the first silicon oxide film from the portion of the semiconductor substrate.

8. A method for manufacturing a semiconductor device according to claim 5; wherein the removing step comprises the step of removing the first silicon oxide film from the portion of the semiconductor substrate using a chemical containing at least an ammonia-hydrogen peroxide solution so that the silicon oxynitride formed at the interface between the portion of the semiconductor substrate and the first silicon oxide film is completely removed.

9. A method for manufacturing a semiconductor device according to claim 5; wherein the nitriding step includes the step of using an ammonia gas.

10. A method for manufacturing a semiconductor device according to claim 5; wherein the semiconductor device comprises a MOS transistor; and wherein the first silicon oxide film comprises a gate oxide film of the MOS transistor.

* * * * *

UNITED STATES PATENT AND TRADEMARK OFFICE
CERTIFICATE OF CORRECTION

PATENT NO. : 7,056,836 B2  Page 1 of 1
APPLICATION NO. : 10/616732
DATED : June 6, 2006
INVENTOR(S) : Hitomi Sakurai It is certified that error appears in the above-identified patent and that said Letters Patent is hereby corrected as shown below:

Title Page items 12 and 75
In the heading, in the listing of the inventor (item 75), change "Hitomi Watanabe" to --Hitomi Sakurai--.

Signed and Sealed this

Eighteenth Day of November, 2008

JON W. DUDAS
*Director of the United States Patent and Trademark Office*